(12) United States Patent
Shepard

(10) Patent No.: US 8,000,129 B2
(45) Date of Patent: Aug. 16, 2011

(54) FIELD-EMITTER-BASED MEMORY ARRAY WITH PHASE-CHANGE STORAGE DEVICES

(75) Inventor: Daniel R. Shepard, North Hampton, NH (US)

(73) Assignee: Contour Semiconductor, Inc., N. Billerica, MA (US)

( * ) Notice: Subject to any disclaimer, the term of this patent is extended or adjusted under 35 U.S.C. 154(b) by 88 days.

(21) Appl. No.: 12/339,696

(22) Filed: Dec. 19, 2008

(65) Prior Publication Data

US 2009/0161420 A1     Jun. 25, 2009

Related U.S. Application Data

(60) Provisional application No. 61/008,184, filed on Dec. 19, 2007, provisional application No. 61/035,140, filed on Mar. 10, 2008, provisional application No. 61/090,694, filed on Aug. 21, 2008.

(51) Int. Cl.
*G11C 13/00*     (2006.01)

(52) U.S. Cl. .......... 365/151; 365/105; 365/118; 365/34; 257/4

(58) Field of Classification Search .......... 365/34, 365/151, 105, 118
See application file for complete search history.

(56) References Cited

U.S. PATENT DOCUMENTS

| | | | | |
|---|---|---|---|---|
| 4,321,661 | A | | 3/1982 | Sano |
| 5,148,461 | A | * | 9/1992 | Shoulders ..................... 378/119 |
| 5,235,187 | A | * | 8/1993 | Arney et al. ..................... 850/58 |
| 5,363,021 | A | * | 11/1994 | MacDonald ................. 315/366 |
| 5,371,431 | A | * | 12/1994 | Jones et al. .................... 313/309 |
| 5,529,524 | A | * | 6/1996 | Jones ............................... 445/24 |
| 5,612,712 | A | * | 3/1997 | Kumar et al. ................. 345/75.2 |
| 5,644,190 | A | * | 7/1997 | Potter .......................... 313/336 |
| 5,656,525 | A | * | 8/1997 | Lin et al. ......................... 216/11 |
| 5,675,531 | A | * | 10/1997 | McClelland et al. ......... 365/151 |
| 5,754,009 | A | * | 5/1998 | Hayes ........................ 315/169.3 |
| 5,889,694 | A | * | 3/1999 | Shepard ....................... 365/105 |
| 5,993,277 | A | * | 11/1999 | Hattori .............................. 445/24 |
| 6,198,645 | B1 | | 3/2001 | Kotowski et al. |
| 6,233,594 | B1 | * | 5/2001 | Tan et al. ....................... 708/313 |
| 6,306,740 | B1 | | 10/2001 | Hattori et al. |
| 6,554,673 | B2 | * | 4/2003 | Pehrsson et al. ................. 445/50 |
| 6,586,327 | B2 | | 7/2003 | Shepard |
| 6,703,252 | B2 | * | 3/2004 | Chen et al. ...................... 438/20 |
| 6,741,524 | B2 | * | 5/2004 | Ichihara et al. ............ 369/13.01 |
| 7,667,996 | B2 | * | 2/2010 | Shepard ....................... 365/118 |
| 2003/0016553 | A1 | | 1/2003 | Subramanian et al. |

(Continued)

FOREIGN PATENT DOCUMENTS

EP         0 479 450  A     4/1992

(Continued)

OTHER PUBLICATIONS

International Search Report and Written Opinion for PCT/US2008/087652, mailed on Mar. 27, 2009.

(Continued)

*Primary Examiner* — Viet Q Nguyen
(74) *Attorney, Agent, or Firm* — Bingham McCutchen LLP

(57) ABSTRACT

Embodiments of the present invention include systems and methods for three-terminal field-emitter triode devices, and memory arrays utilizing the same. In other embodiments, the field-emitter devices include a volume-change material, capable of changing a measurable electrical property of the devices, and/or three-dimensional memory arrays of the same.

18 Claims, 8 Drawing Sheets

U.S. PATENT DOCUMENTS

| | | | |
|---|---|---|---|
| 2005/0127350 A1* | 6/2005 | Furkay et al. | 257/4 |
| 2006/0062043 A1 | 3/2006 | Roehr et al. | |
| 2007/0034921 A1 | 2/2007 | Daley et al. | |
| 2008/0175032 A1 | 7/2008 | Tanaka et al. | |
| 2009/0001337 A1 | 1/2009 | Furukawa et al. | |

FOREIGN PATENT DOCUMENTS

| | | |
|---|---|---|
| EP | 1 261 024 A | 11/2002 |
| EP | 1 300 868 | 4/2003 |
| EP | 1 426 942 A | 6/2004 |
| WO | WO-2008/030351 A2 | 3/2008 |

OTHER PUBLICATIONS

Partial International Search, PCT/US2009/069899, dated Apr. 9, 2010, 3 pages.

Communication Relating to the Results of the Partial International Search, filed in PCT/US2010/026775, dated Jun. 14, 2010, 4 pages.

International Search Report and Written Opinion for PCT/US2009/069899, dated Mar. 19, 2010, 17 pages.

\* cited by examiner

FIELD-EMITTER-BASED MEMORY ARRAY WITH PHASE-CHANGE STORAGE DEVICES

CROSS-REFERENCE TO RELATED APPLICATIONS

This application claims priority to and the benefit of U.S. Provisional Patent Application Ser. No. 61/008,184, filed on Dec. 19, 2007; U.S. Provisional Patent Application Ser. No. 61/035,140, filed on Mar. 10, 2008; and U.S. Provisional Patent Application Ser. No. 61/090,694, filed on Aug. 21, 2008, the disclosures of which are hereby incorporated herein by reference in their entirety.

TECHNICAL FIELD

In various embodiments, the present invention relates to information-storage devices, and more particularly to information-storage devices in which the storage elements are three-terminal emitter devices, in which the storage elements are constructed of layered arrays, and in which the storage elements include phase change and/or alloyed materials.

BACKGROUND

Many types of non-volatile storage cells exist in the prior art, including trapped charge devices (such as flash memory), altered resistivity devices (such as phase-change or chalcogenide memory), and many more. Flash memory is relatively fast, but has a short data retention time. Phase-change materials have longer data retention and have access speeds comparable to that of flash, but they are sensitive to temperature extremes during processing. Many memory architectures have also been disclosed in which the storage arrays are constructed in three dimensions ("3D"). Fabricating memory arrays in 3D is challenging because the semiconducting materials used may require high-temperature deposition or anneal steps. Therefore, a need exists for a 3D memory that has the beneficial properties of phase-change memory but that can be constructed at low temperatures.

Diode arrays represent an alternative to CMOS-based phase-change memory and can be constructed as factory-programmed devices, one-time programmable devices, and reprogrammable devices. A diode array is disclosed in U.S. Pat. No. 5,889,694, the disclosure of which is hereby incorporated by reference in its entirety. In that invention, complementary address inputs are utilized. In U.S. Pat. No. 6,586,327 and U.S. patent application Ser. No. 11/707,739 for "Nano-Vacuum-Tubes and Their Application in Storage Devices," the disclosures of which are hereby incorporated by reference in their entireties, a diode memory is disclosed in which the diodes are constructed with field-emitter devices as the current-rectification elements. In U.S. patent application Ser. No. 11/926,778, the disclosure of which is hereby incorporated by reference in its entirety, a single type of electronic switching device is incorporated to enable the on-chip generation of complementary address pairs and other functionality. Diode memories can be constructed in 3D and at low processing temperatures. When the geometries of a diode array memory become very small, however, the required thickness of the silicon layers that form the diode devices may dictate unacceptably high aspect ratios.

SUMMARY

Use of a field-emitter design may enable smaller thicknesses of the diode structure. Furthermore, the elimination of amorphous silicon films may also significantly reduce the number of processing steps and types of tools needed to fabricate the devices, as well as the highest temperatures and thermal budgets utilized during processing. Embodiments of the present invention eliminate all of the active semiconducting materials required for semiconductor-based diode fabrication in the device and replace them with gated and un-gated field-emitting devices. Two-terminal field emitters may have an IV curve similar to that of a semiconductor diode (inasmuch as they conduct current better in one direction than the other) and three-terminal ones may behave more like a gated diode for which voltage point for the elbow of the IV curve is altered by the gate voltage, i.e., analogously to an FET (albeit an FET for which the source and drain are not necessarily interchangeable). A phase-change material may be added to a field-emitter device to allow the device to store a bit value or other state information.

Field-emitter technology is in use today for flat panel displays and for electron sources in instrumentation. A common emitter type that is manufactured using semiconductor processing techniques is the Spindt emitter.

Embodiments of the present invention include a design for and method of fabricating an array memory utilizing field-emitting devices for both the storage elements and the electronic switching devices. In general, all of the field emitters may be fabricated in the same process, but some may be formed by passing through a third conductor (in addition to the electron-emitting conductor and the electron-receiving anode conductor), and this third conductor is used to gate the current flow from emitter to anode (in a manner analogous to an FET switch). Because diodes and triodes can be constructed vertically with the same geometry (the main difference being the presence or absence of the third gating electrode), triodes may be used in the array as the storage elements (without any loss of bit density), as well as for the switching devices in the periphery of the array.

In general, in one aspect, an electronic device includes a substrate comprising a dielectric material. A plurality of recesses are disposed within the substrate and a bottom conductor layer is disposed at a bottom portion of each recess. A top conductor layer is disposed at a top portion of each recess and electrically connected to an emitter disposed within each recess. A middle conductor layer is disposed in a middle portion of at least one recess and is separated from the emitter by a gap.

One or more of the following features may be included. The bottom conductor layer may include a plurality of generally parallel bottom conductors, the top conductor layer may include a plurality of generally parallel top conductors, and the top conductors may be substantially non-parallel to the bottom conductors. A coating may cover at least a portion of the bottom conductor layer and include a high work-function material and/or a phase-change material. The substrate may include silicon dioxide, the bottom conductor layer may include tungsten or gold, each emitter may include molybdenum, and the top conductor layer may include tungsten or gold.

In general, in a second aspect, a method for forming an electronic device includes forming a plurality of generally parallel bottom conductors on a substrate. A layered structure, including a middle conductor layer, is formed over the plurality of bottom conductors. A plurality of recesses is formed in the layered structure, thereby exposing a portion of a bottom conductor in each recess. An emitter material is formed within each recess, and a plurality of generally parallel top conductors, which are substantially non-parallel (e.g., orthogonal) to the bottom conductors, is formed over the plurality of recesses. The emitter material, a bottom conductor, and a top conductor form a field emitter within each recess.

One or more of the following features may be included. The field emitter may be a diode or a triode; a first field emitter may a diode and a second field emitter may be a triode. A field emitter may have four or more terminals. The layered structure may include or consist essentially of a dielectric film. The method may further include, before forming the emitter material within each recess, forming a spacer material proximate an inner surface of each recess and, after forming the emitter material within each recess, removing the spacer material from each recess. The layered structure may include silicon dioxide, the spacer material may include silicon nitride, each bottom conductor may include tungsten and/or gold, the emitter material may include molybdenum, and each top conductor may include tungsten and/or gold.

The method may further include, before forming the plurality of top conductors, removing portions of the spacer material and the emitter material disposed over the layered structure between the recesses. Portions of the spacer material and the emitter material may be removed by planarization. Forming the layered structure may include forming a first dielectric film over the plurality of bottom conductors, forming the middle conductor layer over the first dielectric film, and forming a second dielectric film over the middle conductor layer and the first dielectric film. At least one recess may intersect the middle conductor layer or may intersect only the first and second dielectric films. The method may further include encapsulating the plurality of recesses and/or disposing a coating above at least one bottom conductor, the coating including a high work-function material and/or a phase-change material.

In general, in another aspect, a storage cell includes first and second conductive materials, and a gap proximate an area between the first and second conductive material. A volume-changing material is proximate the gap, and a change in the volume of the volume-changing material changes the size of the gap.

One or more of the following features may be included. The first conductive material and/or the second conductive material may include a conductive path between a memory array conductor and the storage cell. The volume-changing material may be a phase-change material, and the phase-change material may include a chalcogenide material. The chalcogenide material may include germanium, antimony, and/or tellurium. The gap may include a vacuum, ionizing material, and/or dielectric material. The size of the gap may determine the information stored. The volume of the volume-changing material may be changed by heating, by passing a current proximate the volume-changing material, and/or by passing a current through the cell.

In general, in another aspect, an information-storage device includes storage cells, and the storage cells include first and second conductive materials and a gap proximate an area between the first and second conductive material. A volume-changing material is proximate the gap, and a change in the volume of the volume-changing material changes the size of the gap.

One or more of the following features may be included. Multiple cells may be modified during overlapping time intervals. The storage cells may include a plurality of layers. The volume-changing material may include or consist essentially of a chalcogenide material, which may itself include germanium, antimony, and/or tellurium. the first conductive material may include an emitter tip. The gap may include a vacuum, ionizable gas, and/or dielectric material.

In general, in another aspect, a method of storing information includes heating a first layer of a phase-change material disposed over a first emitter tip cathode and cooling the first layer of the phase-change material at a cooling rate. The cooling rate determines a size of a first gap between the first emitter tip cathode and a first anode disposed thereunder, and the size of the first gap defines a bit of information.

The method may further include heating a second layer of phase-change material disposed over a second emitter tip cathode, and, thereafter, a second gap between the second emitter tip cathode and a second anode disposed thereunder is larger than the first gap. The method may also include heating a third layer of phase-change material disposed over a third emitter tip cathode, and, thereafter, a third gap between the third emitter tip cathode and a third anode disposed thereunder is larger than the second gap. The first layer of phase-change material, the first emitter tip cathode, and the first anode may be disposed within a storage cell. The storage cell may itself be disposed proximate a storage element location defined by a point of intersection between first and second sets of generally parallel conductors.

In general, in another aspect, an information-storage device includes an addressable array of field emitters each having a repeatably selectable gap distance defining an information state and circuitry for reading the information state of each field emitter. In various embodiments, the device may also include circuitry for setting the information state of each field emitter.

In general, in another aspect, an information-storage device includes an addressable array of information-state indicators, each of which includes a phase-change material capable of assuming any of a plurality of phases. Each phase defines an information state. The device also includes circuitry for reading the information state of each information-state indicator.

The device may also include circuitry for setting the information state of each information state indicator. The phase-change material may be capable of assuming either of two phases or more than two phases.

In general, in another aspect, a method of forming an information-storage device includes forming a plurality of layers. Each layer includes a first set of generally parallel conductors and a second set of generally parallel conductors intersecting the first set. Each point of intersection between the first and second sets of generally parallel conductors defines a storage element location. A storage cell including a phase-change material is formed proximate at least one storage element location at a processing temperature not exceeding the breakdown temperature of the phase-change material. In various embodiments, the processing temperature may not exceed approximately 400° C., 200° C., or 25° C. Forming the storage cell may further include encapsulating the phase-change material while under vacuum or in an ambient comprising an ionizable gas.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations.

BRIEF DESCRIPTION OF THE DRAWINGS

In the drawings, like reference characters generally refer to the same parts throughout the different views. In the following description, various embodiments of the present invention are described with reference to the following drawings, in which.

DETAILED DESCRIPTION

Embodiments of the present invention include a field-emitter information-storage cell, with an optional third terminal, wherein information is stored by changing the volume of a material in the cell. By incorporating a phase-change material in the memory cell (or other material the volume of which may be altered electrically, thermally or otherwise), one may alter the volume of the phase-change material and thereby change the emitter gap to determine the state of the bit or bits stored therein.

Figure 1:
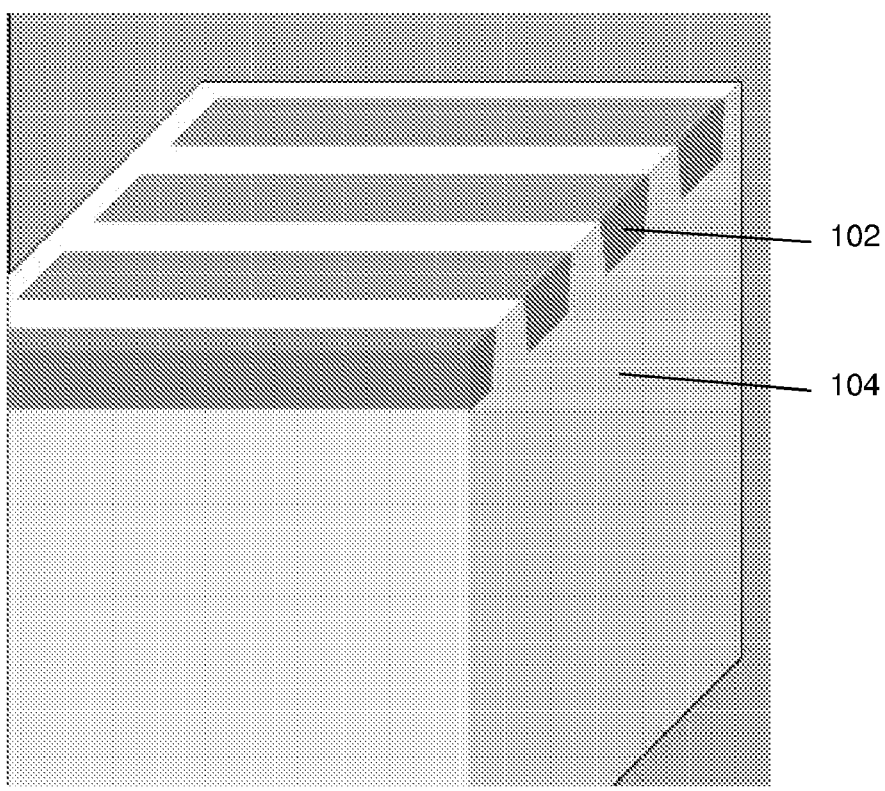
FIG. 1 illustrates a perspective view of a portion of a substrate following damascene patterning of a bottom metal in accordance with an embodiment of the invention.

The application of a field emitter based diode to build a diode array is disclosed in the '739 application mentioned above. As depicted in FIG. 1 hereof, embodiments of the present invention begin with the formation of bottom conductors 102 on a substrate 104 having a dielectric surface (or on a dielectric substrate). The bottom conductors 102 may be formed by a damascene-like process (i.e., deposition in and over trenches or other openings, followed by planarization). Alternatively, the bottom conductors 102 may be formed by a conventional lithographic process (including photolithography, imprint lithography, or the like), which defines portions of the substrate where the bottom conductors 102 are to be removed. These portions are then etched, filled with dielectric material, and planarized.

In the case of a memory device, the bottom conductors 102 may be patterned at the smallest geometry the patterning process allows to create a memory cell with a high density. The bottom conductors 102 may include or be coated by a high work-function material, such as platinum (Pt), gold (Au), selenium (Se), and/or nickel (Ni). The coating may be accomplished by selective growth of the high work-function material on the selectively formed bottom conductors 102 or, alternatively, the bottom conductors 102 may be etched back slightly and the etched area then filled with the high work-function material (the surrounding material being removed by planarization). If the bottom conductors 102 are formed by a conventional lithographic process, the lithographic patterning may be preceded by a deposition of a coating layer of the high work-function material following the blanket deposition of the bottom conductive layer. In an alternate embodiment, a phase-change material is deposited in place of (or in addition to) the high work-function material to provide a programmable capability to the memory cell diodes and/or triodes, as explained further below. Both a high work-function material and a phase-change material may be incorporated in various embodiments by, e.g., further incorporating a masking and patterning step to selectively place the phase-change material only in certain emitter devices where programmability is desired and/or high work-function material only in other emitter devices where higher on/off ratios are desired.

Figure 2:
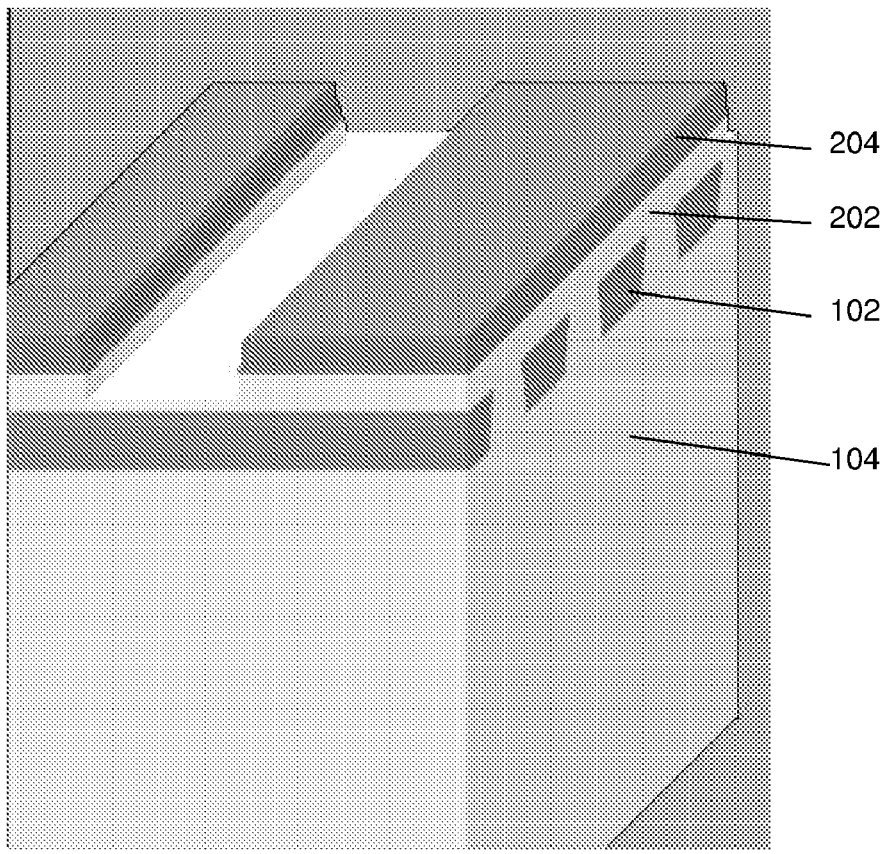
FIG. 2 illustrates a perspective view of a portion of a substrate following deposition of dielectric and middle metal and middle metal patterning in accordance with an embodiment of the invention.

FIG. 2 illustrates blanket deposition of a dielectric spacer material 202 and a conductive middle conductor 204 following formation of the bottom conductors 102. The middle conductor 204 is used to selectively form a third electrode of triode emitter structures. The layers 202, 204 may be deposited by sputtering, chemical-vapor deposition ("CVD"), evaporation, or ALD.

Figure 3:
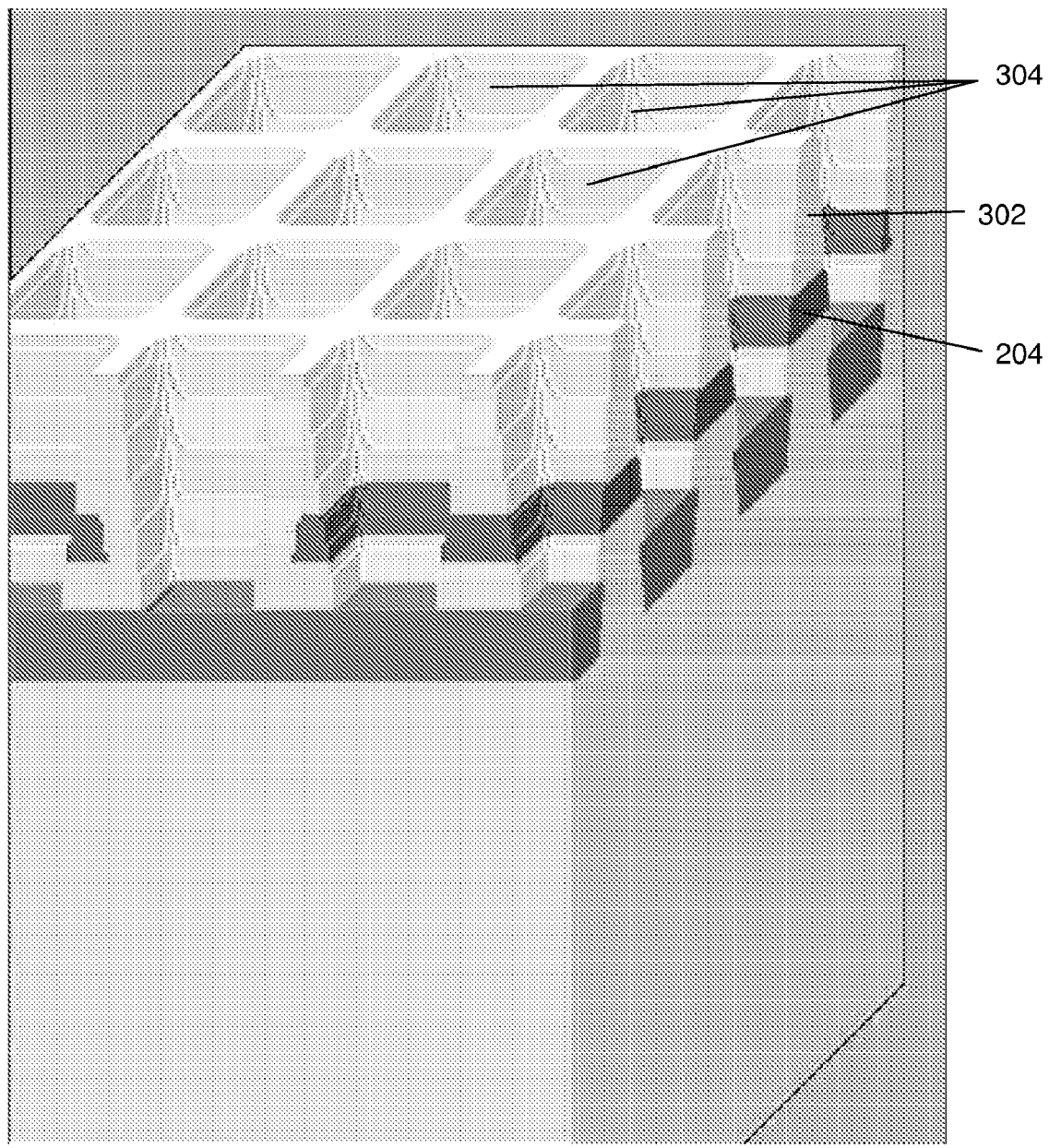
FIG. 3 illustrates a perspective view of a portion of a substrate following deposition of dielectric and planarization and emitter holes etching in accordance with an embodiment of the invention.

FIG. 3 illustrates patterning and etching of the middle conductor 204. Many designs will enable the patterning to be done at larger geometries than the critical geometry of the dense memory array conductors. The etch has, in some embodiments, a wide process window (i.e., is tolerant of over-etching) because the next step in the process is deposition of an upper spacer 302 on the middle conductors 204, and the upper spacer 302 fills in any over-etched area with more dielectric. The upper spacer 302 is then planarized, patterned, and etched to match the etching of the middle conductor 204, thereby forming pits 304 where, later, emitters will be formed. The planarization of the upper spacer 302 may contribute to the shape of the emitter pits 304 and is preferably carefully monitored. A technique for more precisely adjusting the thickness of the upper spacer 302 may first include planarizing the upper spacer 302 to a thickness greater than the desired thickness, followed by precision measurement of the thickness of the upper layer 302 to enable the application of a precision blanket etch to define the final thickness. The emitter pits 304 are typically at the finest available geometry and are etched down through to the bottom conductors 102; this etch is preferably selective to the bottom-conductor material (and/or the high work-function coating, if included) in order to stop on the bottom conductors 102. In the case of a field-emitter diode, a pit is formed solely in the dielectric material; in the case of a field-emitter triode, the pit passes through the layer of middle conductor material. The thickness of the upper spacer 302 defines the distance of the middle conductor 204 from the bottom conductor 102 and the thickness of the middle conductor 204 sets the area of the middle conductor surrounding the emitter (still to be formed, as described below) for gating the emitter characteristics. A thicker upper spacer 302 enables placing the middle conductor 204 further up the shaft of the emitter away from the tip whereas a thinner upper spacer 302 enables placing the middle conductor further down the shaft of the emitter towards the tip or even beyond the tip.

In an alternative embodiment, the emitter pits 304 may be formed in the substrate prior to the formation of the bottom conductors 102. This technique is explained in detail in the '739 application. The surface topography of the substrate 104 is first etched to create a plurality of feature depths. In particular, in one embodiment, the substrate 104 includes a three level topography, i.e., a topography including features having one of three different possible depths, in addition to the unetched surface. The shallowest feature will result in a via that will connect a top conductor to the bottom conductor 102. The next-deepest feature will result in a bottom conductor 102 crossing underneath a top conductor without connection. The deepest feature will result in a field emitter device. Once the substrate 104 is patterned, a bottom conductor 102 may then be deposited. The width of the feature openings in the substrate may be reduced by the coating of the bottom metal material on the sidewalls of those features.

Figure 4:
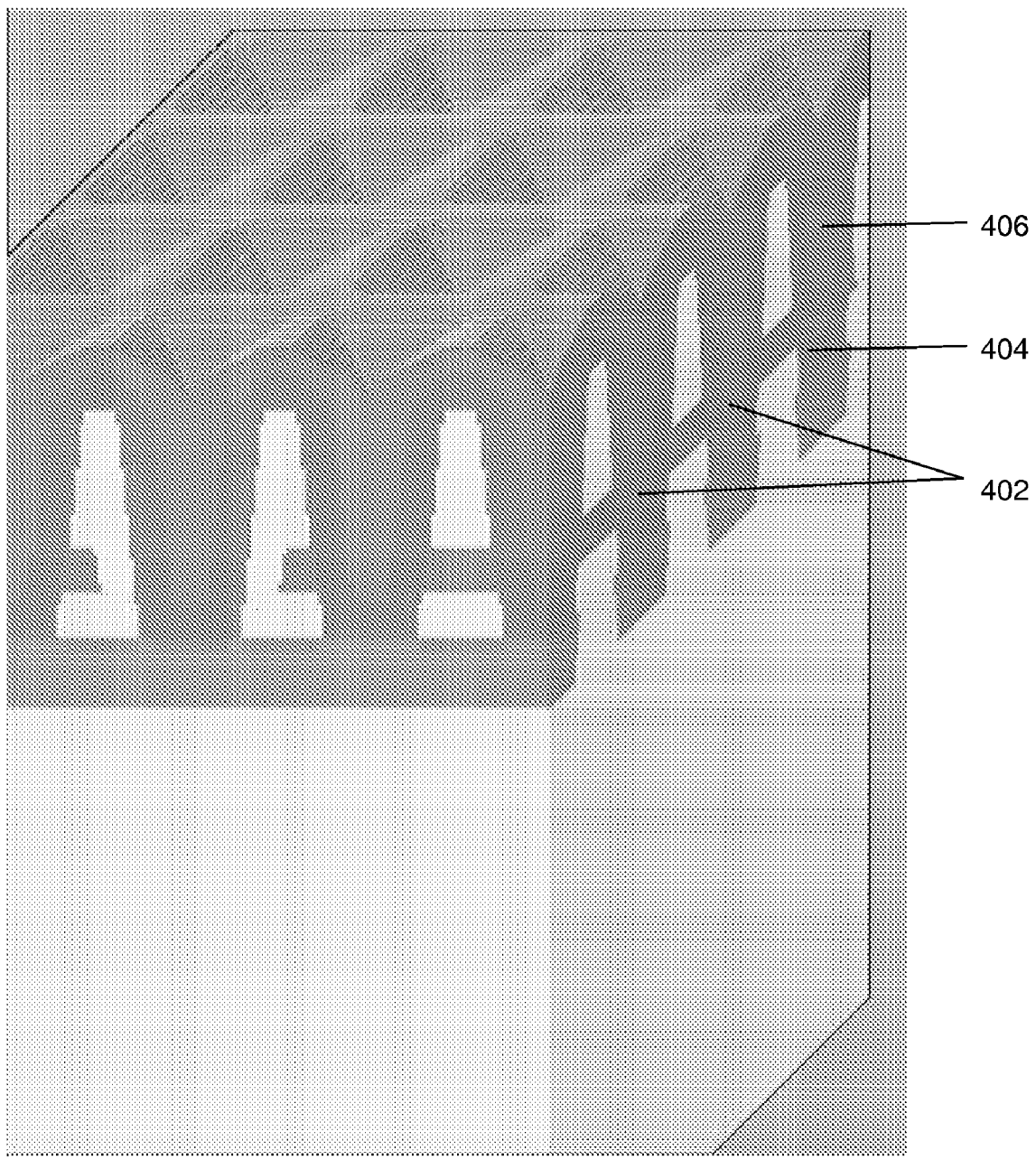
FIG. 4 illustrates a perspective view of a portion of a substrate following atomic layer deposition ("ALD") of spacer material and emitter metal in accordance with an embodiment of the invention.

Next, as depicted in FIG. 4, the emitters 402 are formed by conformally filling the emitter pits 304 with an emitter-spacer material 404 followed by the emitter material 406 itself. The emitter material may be a etch-resistant metal, such as nickel, a low-work-function material, such as germanium, or a combination of layers thereof. In one embodiment, the emitter is coated with a layer of etch-resistant and/or low-work-function material between the spacer 404 and emitter 406 materials. These layers may be deposited by a variety of techniques well known in the art, but, in one embodiment, ALD is preferred. The emitter-spacer material 404 may be a material resistant to a later plasma or reactive ion etch ("RIE"), such as chromium, nickel, or aluminum oxide. To prevent the formation of an alloy that may cause difficulty in later processing steps, a layer of buffer material may be deposited between the emitter material 406 and the emitter-spacer material 404, or, in other embodiments, between the other conductor layers and spacer layers.

The emitter material 406 layer, or any of the individual layers, may be preceded by a thin layer of material (not shown) to help promote adhesion or to act as a material migration barrier. The thin layer may be titanium or one of many other materials well known to those versed in the art of semiconductor device fabrication.

Figure 5:
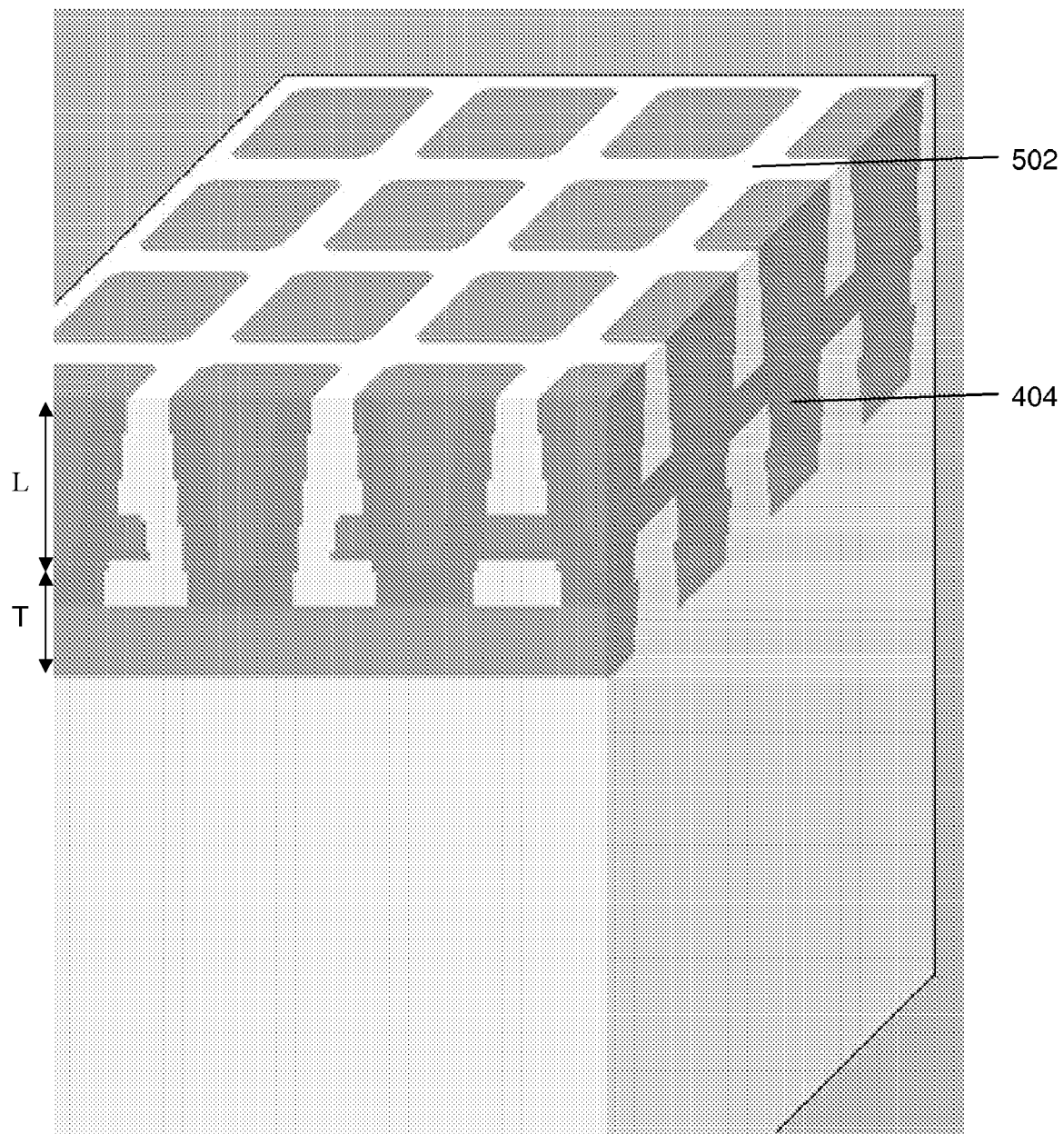
FIG. 5 illustrates a perspective view of a portion of a substrate following emitter top planarization in accordance with an embodiment of the invention.

Next, a planarization step separates and isolates the individual emitter elements 402, as depicted in FIG. 5. This planarization step results in a flat surface 502, suitable for top conductor formation, and sets the length L of the emitter pits 304 and should be carefully monitored. In one embodiment, the planarization step is replaced or preceeded by lithographic patterning of the individual emitters 402, such that the top of each emitter 402 is protected with photoresist and/or a hard-mask material (not shown), followed by directional (i.e., anisotropic) etching of the exposed emitter material 406 and emitter-spacer material 404. This etching may leave a small post of the emitter material above each emitter which will be surrounded and contacted by the top metal of the subsequent top metal deposition step.

In one embodiment, the substrate 104 is not etched, or is etched at a much slower rate than other etchable materials. This result may be achieved by fabricating the substrate with a material, such as PMMA or other plastics, having a slow etch rate or by applying a coating (such as aluminum oxide) to the substrate prior to depositing the first film that is selectively not etched when the other materials are etched.

In one embodiment, the bottom metal layer includes tungsten, the spacer material includes aluminum oxide, and the emitter tip material includes aluminum. A fluorine-based RIE etch may be used to etch the tungsten bottom metal layer and will etch the PMMA substrate much more slowly. Wet etch removal of the spacer material may be accomplished by a wet etch dip in hydrofluoric acid ("HF"). The depth of the features and the thicknesses of the films are such that the shallowest feature may have a depth that is slightly shallower than the thickness of bottom metal layer. The middle depth feature may be slightly shallower than the thickness of bottom metal plus half to three quarters the thickness of spacer material. The depth of the deepest feature is a function of the thickness of bottom metal layer, spacer material, the width of the deepest feature, and the desired shape of the field emitter. In general, the depth may be equal to the desired length L of the emitter 402 plus the thickness T of the bottom conductor 102 and emitter spacer material 404. The width of the deepest feature may generally be equal to the desired width of the emitter pit 304 plus the twice the thickness of bottom conductor 102 and twice the thickness of emitter spacer material 404. The thickness of the emitter spacer material 404 controls the size of the field emitter gap. The size and shape of the field emitter may be determined by the crevice formed as the spacer material fills in the emitter pit 304 as that material closes in from the opposite sides.

Figure 6:
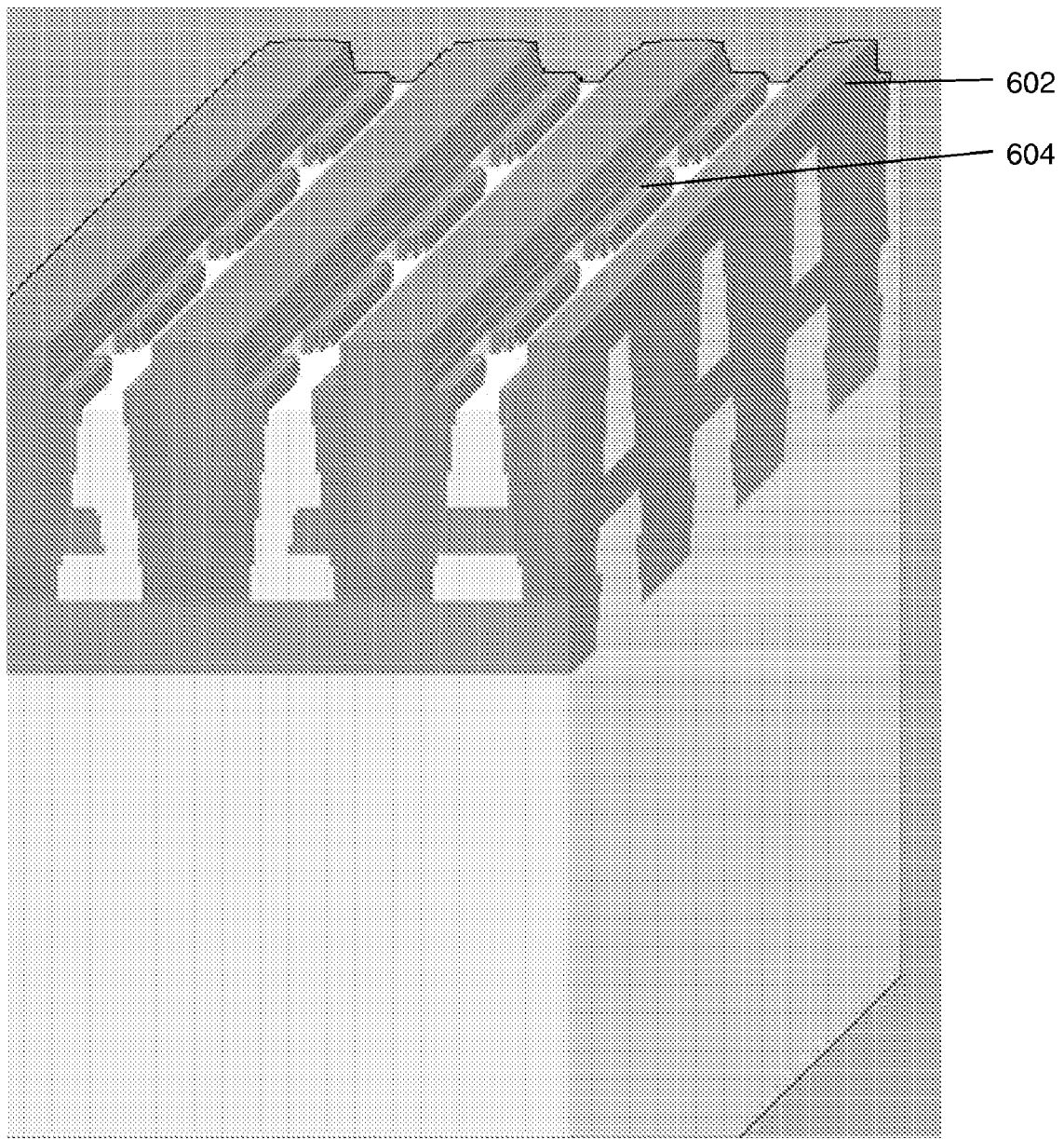
FIG. 6 illustrates a perspective view of a portion of a substrate following top metal deposition, patterning, and etch with overetch in accordance with an embodiment of the invention.

The top conductors 602 are then formed as depicted in FIG. 6, preferably by depositing the top conductor material, patterning, and etching. The top conductor material may include, for example, tungsten, molybdenum, or other metals. The patterning (by photolithographic or imprint-lithographic patterning and etching, or other techniques known to those skilled in the art) may be at the finest geometry available because it sets one of the dimensions of the memory array. The etch of the top conductor 602 should proceed far enough to expose a top surface 604 of the emitter spacer material 404. The etch proceeds below the top conductor layer 602 and may incorporate an undercutting quality to wrap around and below the top conductors 602 if the top conductors 602 are wider than or similar to the width of the emitter pits 304. Care should be taken not to completely undercut the top conductors 602, however, as this might release the combined top conductor-emitter structures from the substrate. In one embodiment, a non-conductive filler material (not shown) is deposited before the top conductors 602 are formed to help structurally support the top conductor material and to help to seal the vacuum chambers and prevent outgassing of material from the substrate 104 into the emitter chambers. A planarization step may follow deposition of the non-conductive filler material. The planarization exposes those portions of the bottom conductor material formed at the shallowest substrate features to create an electrical connection between the bottom conductor material and the top metal (yet to be deposited). The planarization also exposes the contacts to the field emitters at the deepest features to facilitate an electrical connection between the field emitters and the top conductor material.

Figure 7:
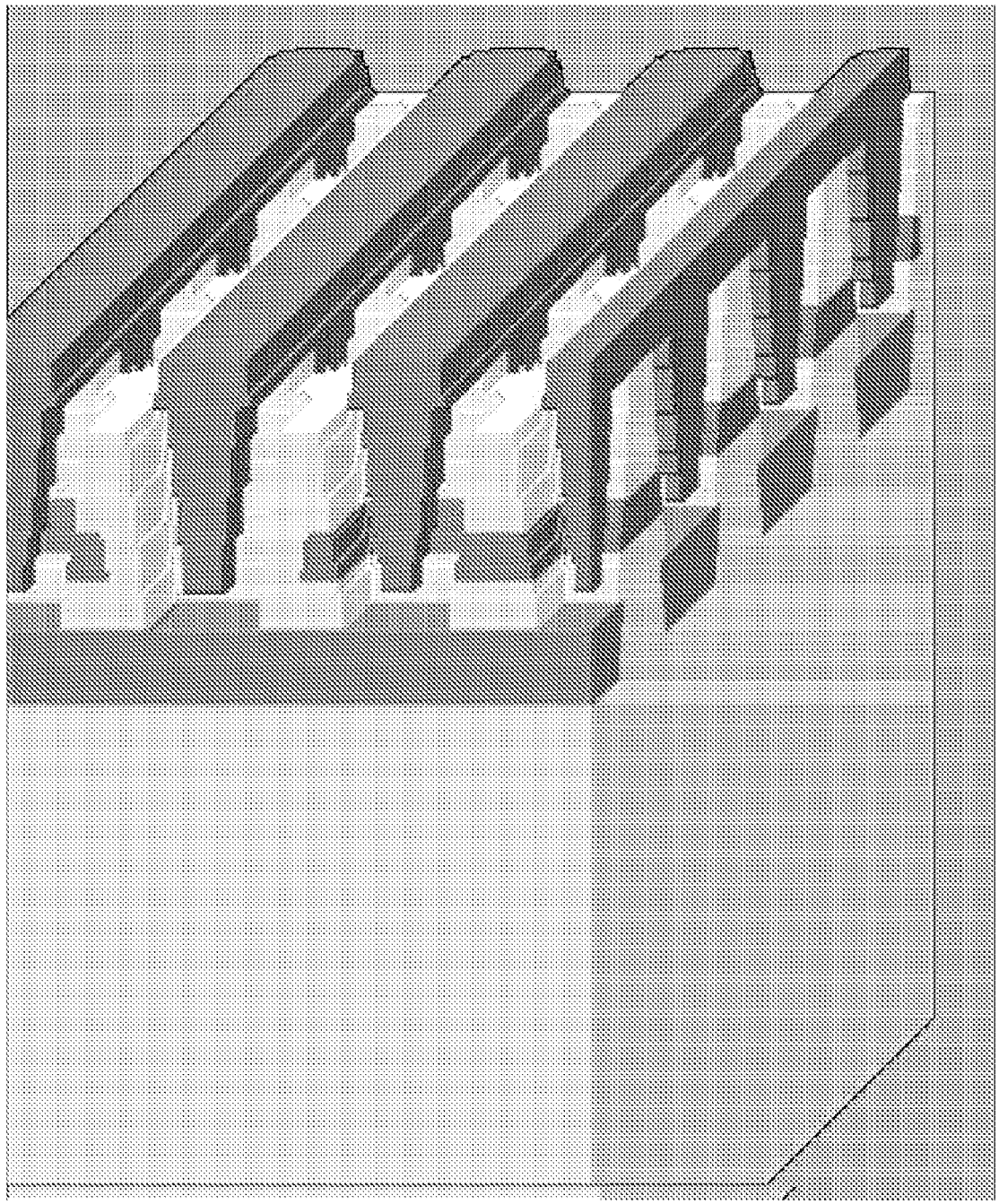
FIG. 7 illustrates a perspective view of a portion of a substrate following spacer removal in accordance with an embodiment of the invention.

Having formed the top conductors 602 and exposed the emitter-spacer material 404, the emitter spacer material 404 is chemically etched away as depicted in FIG. 7. In alternative embodiments, the emitter spacer material 404 is etched with angled plasma etching or RIE etching. The emitter-spacer material 404 may be a material that is easily removed without damaging or affecting the other materials. Exemplary embodiments utilize silicon oxide as the dielectric material, silicon nitride as the emitter-spacer material, tungsten (or one or more noble metals, such as gold) as the bottom conductor (optionally with platinum as a high work-function coating), molybdenum as the emitter material, and tungsten (or one or more noble metals, such as gold) as the top conductor material, while further utilizing phosphoric acid to remove the emitter-spacer material.

In one embodiment, the top conductors 602 are supported by the substrate 104 at some points and by filler material at others. The top conductors 602 may also be supported and make an electrical connection to the bottom conductors 102 at the location of shallow substrate features. In other places, the top conductors 602 cross over the bottom conductors 102 without making electrical connections.

Finally, the substrate may be encapsulated with or without an ionizing gas present in the emitter chambers, as disclosed in U.S. patent application Ser. No. 11/707,739, to create a vacuum in the field-emitter devices. The encapsulation layer may be a dielectric layer deposited in a non-conformal deposition process, such as an e-beam vacuum evaporator. The non-conformal nature of this deposition method results in the encapsulation material partly filling in the sides of the field emitters but without filling the gap between the emitter 402 and the sides of the emitter pit 304. The deep vacuum of this deposition process also results in a vacuum being trapped in the encapsulated field emitter, resulting in the formation of a vacuum-tube-like device. A passivation layer may be deposited over the encapsulation layer to strengthen it and better protect the devices below.

Vertical via connections between two or more layers may be formed, using the same materials as the top and bottom conductors (or other conductive materials), by patterning and etching. Typically, via holes may be formed following planarization (or formation by lithographic patterning and etching) of the emitter structures (as depicted in FIG. 5) with a depth set to stop upon the lowest layer to be contacted. If a contact from the top conductor to only the bottom conductor is desired, the middle conductor is patterned to remove the middle conductor material from the area where the via is to be formed. If, on the other hand, a contact from the middle conductor to only the bottom conductor is desired, the top conductor is patterned to not connect to the top conductor material at that point. These via holes may be filled by the deposition of the top conductor material, with other conductive material by ALD, or by using other standard techniques prior to deposition of the top conductor material. Contacts to these via plugs may be patterned along with other conductor structures.

FIG. 7 illustrates both two-terminal devices (e.g., diodes), in which electron flow occurs by field emission from the emitter tip to the opposing anode area on the bottom conductor, and gated two-terminal devices (i.e., three terminal devices, triodes, or gated field-emitters), in which the voltage or charge on the middle conductor may be varied to alter the flow of electrons occurring by field emission (including altering the field threshold at which electron emission will occur) from the emitter tip to the opposing anode area on the bottom conductor. Operation of field emitters and gated field emitters is well understood by those skilled in the art.

In an embodiment, multiple middle conductive layers may be utilized (each spaced from the others by a dielectric layer), thereby forming devices having four (or more) terminals. Such implementations may include two-gate devices in which one gate is a control (i.e., switching) gate and the other is an electron acceleration control gate for specific applications. The techniques for forming multiple gates may generally include the deposition of a second spacer dielectric on top of the first middle conductor followed by deposition of the second middle conductor. Emitter pit formation would then be through both middle conductor layers. For formation of emitter devices having different characteristics, some emitter pits may be patterned to stop on the lower (first) middle conductor instead of the bottom conductor, thereby resulting in the formation of some emitters with shorter shafts (this technique may also be implemented for a device having only three conductive layers whereby either the middle layer or the bottom layer may be an emitter anode, depending on the depth and location of a given emitter pit). Additional layers may be formed above the top conductor layer with the dielectric spacer being formed in whole or in part with the encapsulation of the emitters below. Generally speaking, in a given design, diodes may be formed between any two layers and gated devices (e.g., triodes or devices with more than three terminals) may be formed between and three or more layers as a function of the patterning of the various layers and the depth and location of the emitter holes. Via formation may be as described above with the various layers being patterned such that a given via hole only passes through the conductive material in a layer that is to be contacted by that via plug.

Figure 8:
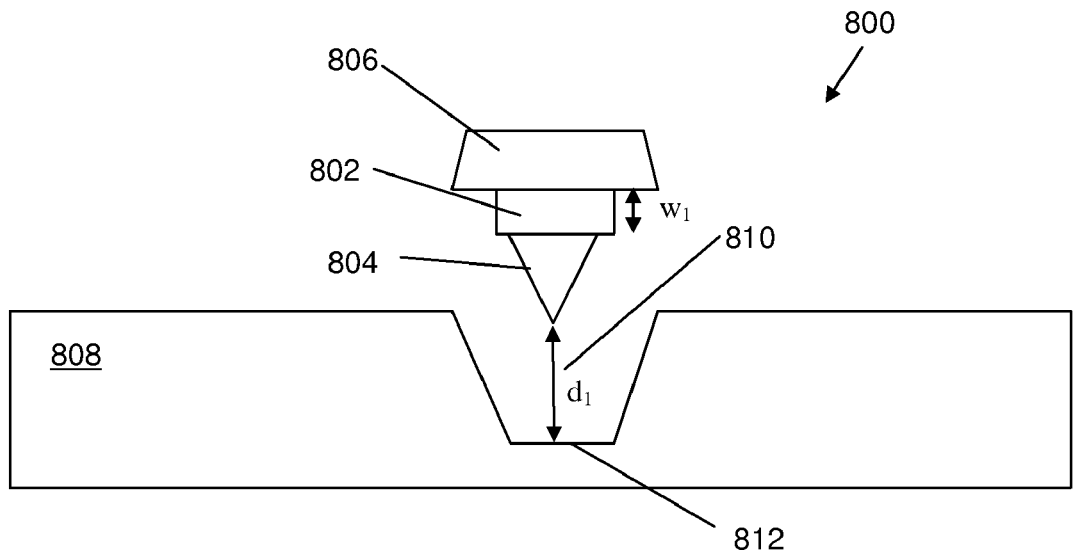
FIG. 8 illustrates a side view of one type of storage bit including a field emitter and showing the stored bit programmed to a particular state in accordance with an embodiment of the invention.

As mentioned above, a volume-change material ("VCM") may be added to a field-emitter cell, thereby allowing the cell to store information. FIG. 8 illustrates a side view of a field-emitter cell 800 as described above. The VCM 802 attaches the emitter tip 804 to a top conductor 806. The emitter tip 804 is separated from a substrate 808 by a gap 810. As described above, the gap 810 may be a vacuum, or may be filled by a dielectric or an ionizing gas. The substrate 808 may be conductive or may be coated with a layer of conductive material. The substrate 808 may be shaped as a "cup" opposite the emitter top 804, as shown, or may be flat. In this state, the VCM has a width $w_1$ and, thus, the emitter tip 804 is separated from a surface 812 of the substrate 808 by a distance $d_1$. In this embodiment, the emitter tip 804 acts as a cathode, emitting electrons toward the substrate 808, which acts as an anode.

Figure 9:
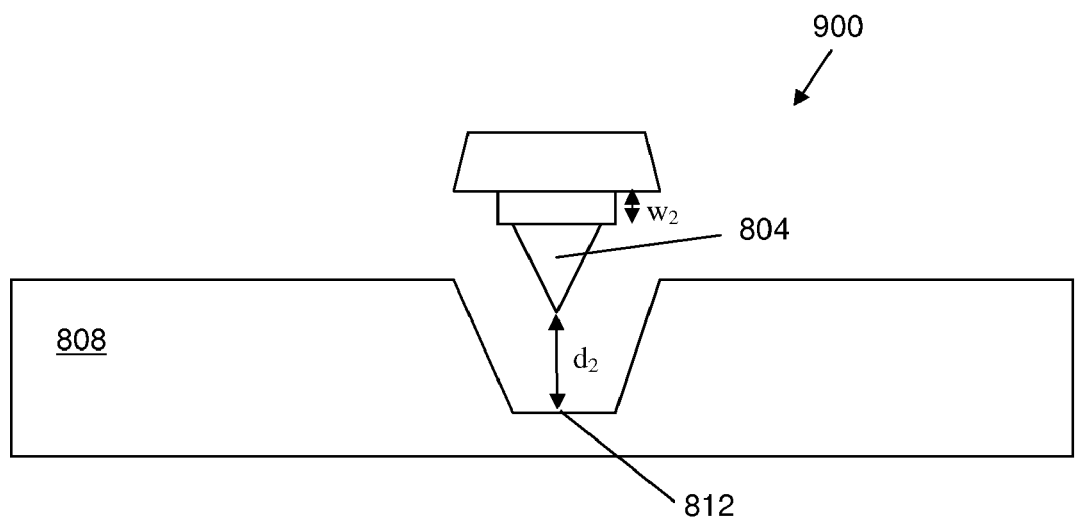
FIG. 9 illustrates a side view of one type of storage bit including a filed emitter and showing the stored bit programmed to a different state from that illustrated in FIG. 8 in accordance with an embodiment of the invention.

FIG. 9 shows a similar field-emitter cell 900 programmed to a different state by VCM 802 having a smaller volume. Here, the VCM 802 has a different width $w_2$, causing the emitter tip 804 to be separated from the surface 812 of the substrate 808 by a new distance $d_2$.

In one embodiment, the VCM is a phase-change material. Suitable phase-change materials include chalcogenides, such as a germanium-antimony-tellurium (GeSbTe, or "GST") material. A GST material may exhibit a volumetric change as large as 5% between its amorphous and crystalline phases. By suspending the emitter tip 804 from a layer of GST material (or other suitable phase-change material), the size of the emitter gap 810 may be expanded or contracted as a function of the GST phase. In particular, if the GST layer thickness is 40 nm and the emitter gap 810 is 20 nm, a 5% expanding change (2 nm) in the GST layer produces a 10% narrowing (2 nm of 20 nm) of the emitter gap 810. The ratio of VCM thickness to the gap size forms a multiplier on the percentage change of the VCM. Any material having a changeable volume is a candidate for the present invention.

One may predict, using Fowler-Nordheim theory, the resulting current, I, for a given voltage, V, according to the following equation:

$$I = aV^2 e^{-b/V} \qquad [1]$$

where

Error! Objects cannot be created from editing field codes. [2]

and $$b \approx 6.44 \times 10^7 \phi^{3/2} / \beta. \qquad [3]$$

Enhancement of the field F, at the emitter tip for a given applied voltage V, is related to β according to the following equation:

$$F = \beta V \quad [4]$$

where β is a function of the radius r of the cathode emitter tip, the spacing R between the cathode emitter and the anode; and a constant k. The constant k takes into account the shank of the cathode emitter according to the following formula:

$$\beta = \frac{R}{kr(R-r)}. \quad [5]$$

Where the tip radius is very small compared to the cathode to anode gap (r<<R), β may be approximated as:

$$\beta \cong \frac{1}{kr}. \quad [6]$$

The onset of field emission is generally accepted to occur at fields on the order of $10^7$ V/cm; this value may be used in conjunction with equation [4] to determine the turn-on voltage. Note that in the reverse-biased condition, the shape of the substrate/anode ensures that there is no field enhancement, resulting in very limited reverse leakage current. Because there is no emitter tip in the reverse direction (i.e., r=∞), the difference in the value of β between forward- and reverse-bias can be several orders of magnitude and, because current is related to $\beta^2$, the on-off ratio may be $10^{14}$ or more.

For example, given an emitter tip radius of 250 Å and a cathode-to-anode gap of 255 Å with an assumed emitter coating of cesium (which has a work function of approximately 2.2 eV), an applied voltage of only 1.0 V will generate an electric field of $2.0 \times 10^7$ V/cm and a forward current of 100 µA. Narrowing of the cathode-to-anode gap by a single angstrom to 254 Å increases the field to 2.5×107 V/cm (an increase of 25%) and increases the forward current to 1.2 mA (an 12-fold increase). This sensitivity to gap spacing, along with the VCM amplification related to the ratio of the gap to the VCM thickness, provides considerable gain for sensing the data bit. If fact, this gain enables the sensing of intermediate amorphous states, thereby making it possible to store multiple bits per cell.

In a preferred embodiment, the structure of the field-emitter diodes is downward-pointing, i.e., the emitter tip 804 is above the substrate 808. Other embodiments include vertical structures, with upward-pointing cathode emitter tips (which may face anodes that are distantly spaced hundreds of nanometers away), or lateral structures. In a preferred embodiment, the emitter cathode faces a cup-shaped anode, as shown in FIGS. 8-9, that further enhances the field in the forward-biased direction while further limiting the field in the reverse-biased direction (when compared to a flat surface for the anode).

Many possible low-work-function materials are contemplated as coatings for the emitter tips. These materials include elements such as diamond (carbon) and cesium, as well as zirconium carbide (ZrC), aluminum nitride (AlN), and labium boride ($LaB_6$). Hafnium carbide (HfC) and indium gallium nitride (InGaN) may also be useful. Diamond may be deposited with a CVD process, is very stable as a surface coating, and has a negative electron affinity (meaning electrons are emitted very easily from its surface). Other materials are potential emitter materials. In some embodiments, the cathode-to-anode gap is filled with a dielectric material, rather than a vacuum, or with an ionizing gas.

A fabrication approach for manufacturing downward-pointing field emitters utilizing a topolithographic approach is described above. That process may be modified to produce a field-emitter cell containing a VCM, as below. The process begins with a substrate with a surface topography formed by imprint lithography or photolithography, including the formation of via openings to the substrate for connections from a first memory layer formed thereon. Generally speaking, that processing consists of the following steps:

1. Deposition of a bottom film stack comprising or consisting of tungsten conformally coated, chrome conformally coated, molybdenum non-conformally coated, and nickel conformally coated. The field-emitter tips are formed by the molybdenum, but other tip materials may be substituted (preferably with a substitute material etchable by RIE but not by HF). The bottom metal preferably has low surface roughness to minimize emission points. Deposition may be performed by CVD techniques or by ALD, which may enable superior thickness uniformities.

2. The bottom film stack is polished, e.g., by CMP, down to the surface of the substrate.

3. The substrate is etched by RIE with a timed etch that removes tungsten and molybdenum (or a substitute emitter tip material).

4. A suitable dielectric material, e.g., $SiO_2$, is deposited.

5. The substrate is polished, e.g., by CMP, a second time to remove the dielectric material, stopping between the surface and a point above the surface to get below the row lines material. This polishing will expose the metal tops of the field emitters at the diodes.

6. A VCM and a top metal layer are deposited and patterned by photolithography, e-beam lithography, imprint lithography, or other patterning means.

7. The substrate is wet-etched in HF. The HF will etch the chromium (which sets the field-emitter gap width and the spacing for cross-overs between rows and columns) and the SiO2 (which provides structural support during top metal deposition) but not the VCM, tungsten, nickel, or the molybdenum (or substitute material) field emitter tips.

8. The substrate is encapsulated, preferably in an e-beam deposition tool because (1) the deep vacuum removes any de-ionized water remaining in the emitter gaps following the HF wet etch, (2) the non-conformal deposition does not fill in the gap underneath the field emitters, and (3) the deep vacuum may remain trapped in the field-emitter gaps during the encapsulation. Alternatively, the substrate can be encapsulated in a low pressure (or normal pressure) environment containing an ionizable gas such as argon, thereby trapping the gas in the gap of each cell. Steps 1-8 are performed for each layer of memory, followed by an additional step of forming a new layer of topography plus via openings to the substrate circuitry to make contact from an optional next memory layer to the substrate.

9. Finally, to better strengthen the seal on the emitter gap vacuum chambers, the substrate with all layers of memory is passivated. A photosensitive polyimide may be used to photolithographically open up the passivated bonding pads. A strengthening dielectric layer may be performed between each memory layer as well. This process may be performed at or near room temperature.

As mentioned above, a small difference in the geometry of a field emitter may have a dramatic impact on the performance thereof. Tip seasoning, surface migration, damage from ballistic electrons and other operational hazards, surface contamination, and the like, are all effects that may affect emitter operation and lifetime. However, given nano-scale geometries, the required fields may be achieved at very low voltages. To the extent that many of these damage-inducing effects are voltage-sensitive (as opposed to field-sensitive) their impacts will be minimized.

Several effects that may degrade the field emitter's operation, such as surface migration, damage from normal operation, and electrode arcing (which can result in the destructive melting of the emitter tip) may instead be advantageously used to make the field-emitter one-time programmable. Using any of these effects for one-time programmability will desirably degrade each selected device and thereby disable or significantly reduce the field emission and create an equivalent opened circuit state. For example, in operation with embodiments of the present invention, expansion of the VCM may be utilized to close the gap to the point of electrical arcing, which would destroy the tip and disable the cell.

Using a GST material as the VCM is preferred in many embodiments of the invention. The GST material can be put into its crystalline phase by running a current through the cell (and, thereby through the GST enough to heat the GST), and slowly diminishing the current (thereby allowing the GST material to cool). The slow cooling permits the atoms of the GST material to align themselves into a crystalline phase. To change the GST material from its crystalline state into its amorphous state, the current may be cut off, abruptly causing cooling to occur rapidly and thereby causing the atoms of the GST material to become trapped in an amorphous phase. Intermediate amorphous phases may be achieved in GST material or another VCM by cutting off the current more rapidly than that required for the crystalline phase but more slowly than that typically used for the amorphous stage.

One drawback to certain materials such as GST is that, at certain elevated temperatures, the alloy may break down (resulting in a material not exhibiting volumetric change behavior, which may be unsuitable for information storage). For example, in certain GST materials, the germanium may separate out from the alloy at temperatures approaching 400° C. When an array is fabricated with semiconducting devices, such as diodes, combined with GST-material storage bit elements, one suitable fabrication method includes forming the diodes first (along with any associated high-temperature steps to deposit the semiconducting material as well as to anneal that material in order to activate any deposited or implanted dopants) and then depositing the GST material afterwards. In this way, the GST material is never exposed to the elevated temperatures of the diode formation. However, in a 3D memory, each layer is generally formed on top of all lower layers. This means that every lower layer is preferably able to survive elevated temperatures associated with any subsequent layers formed above. This has been problematic for prior methods of constructing 3D phase change memories. Embodiments of the present invention, by eliminating the semiconducting materials in favor of field-emitting devices, allows every layer to be constructed at temperatures low enough to remain below that temperature where a VCM would separate. In U.S. Pat. No. 5,835,396, titled "Three-Dimensional Read-Only Memory," address decoders and other logic are disposed in the substrate with multiple layers of diode array memory in layers thereover. The GST-material field-emitter diode array of the present invention may be used, for example, in combination with the design of Zhang such that the high-temperature processing of the substrate occurs before any of the GST material is deposited in the process. Thereafter, the formation of the layers of GST-material field-emitter diode arrays is performed. In some embodiments, the first storage layer is performed at elevated temperatures, but once the GST material is deposited on that first layer, subsequent layers are formed at lower temperatures.

Writing the storage cell in a memory array according to certain embodiments of the present invention is accomplished by heating the VCM in the cell. This heating may be accomplished by passing a current through the cell or by passing a current near enough to the cell to heat it. The amount of current necessary to initiate a phase change in the VCM between its amorphous and crystalline states may be predetermined, and this predetermined value of the current may be applied for a predetermined time. A safety margin may be built into the predetermined values to protect the VCM from overheating and thus liquefying. A bulk erase may be performed by heating the array or a portion of the array, thereby erasing multiple bits concurrently. Heating successive areas of the array may enable lower peak power consumption by starting the erase of groups of bits in succession (overlapping the heating of some bits while not necessarily starting and stopping the heating simultaneously, although this too may be done). Heating the memory device in a heating chamber may erase the entire array at once. The storage cell may be connected at a point of overlap of a row line or a bit line and a column line or a word line of a memory array such as a diode matrix memory array (with the anode to the row or bit line and the cathode to the column or word line or vice versa). The top conductive contact of the storage cell may be the VCM material itself (as shown in FIGS. 8 and 9) or may have some other material (such as a barrier material) to protect the VCM from contamination from the row or column line material. The bottom conductive contact may be the column or row line material itself or may be a liner material in the anode cup such as a high work-function material to hinder reverse leakage, or a material that would not be adversely affected by the electron bombardment from the tip. In other embodiments, the tip may face upwards, laterally, or in any other direction, and the contacts are formed as required for that implementation.

Another embodiment of the present invention utilizes the capacitance between two contacts (where the two contacts represent two parallel plates separated by a gap that determines the capacitance between the plates, and the VCM controls the gap and thereby the capacitance). This approach may not provide the same non-linear sensitivity to the gap size that occurs with the field-emitter version described above.

Another embodiment of the present invention includes the construction of diodes with low-temperature hydrogenated amorphous silicon which is doped in-situ during deposition. Such diodes may be fabricated at temperatures below 200° C.

Another embodiment of the present invention includes placing the PCM material (such as GST) opposite the tip of the field emitter 804 (e.g., as a layer on the bottom conductive layer on the surface 812 of the substrate 808) such that the PCM is bombarded by electrons coming off the emitter tip. Differing amounts of current may cause the PCM material to either anneal or melt, thereby changing its phase, resistivity, and volume. The state of the PCM material may be read by sensing the threshold voltage at which electron emission occurs (which will change due to the emitter gap and resistivity change) or by applying a current low enough to not cause a state change. This alternative approach may be used for one-time-programmable memories as well as for read/write memories.

Embodiments of the present invention may be utilized to create memory devices comprising an array (e.g., a tiled array) of multiple sub-arrays, whereby one or more of these sub-arrays are accessed substantially simultaneously for reading or writing multiple bits of information at a time, or whereby fewer than all of the sub-arrays are accessed at one time for power conservation.

Figure 10:
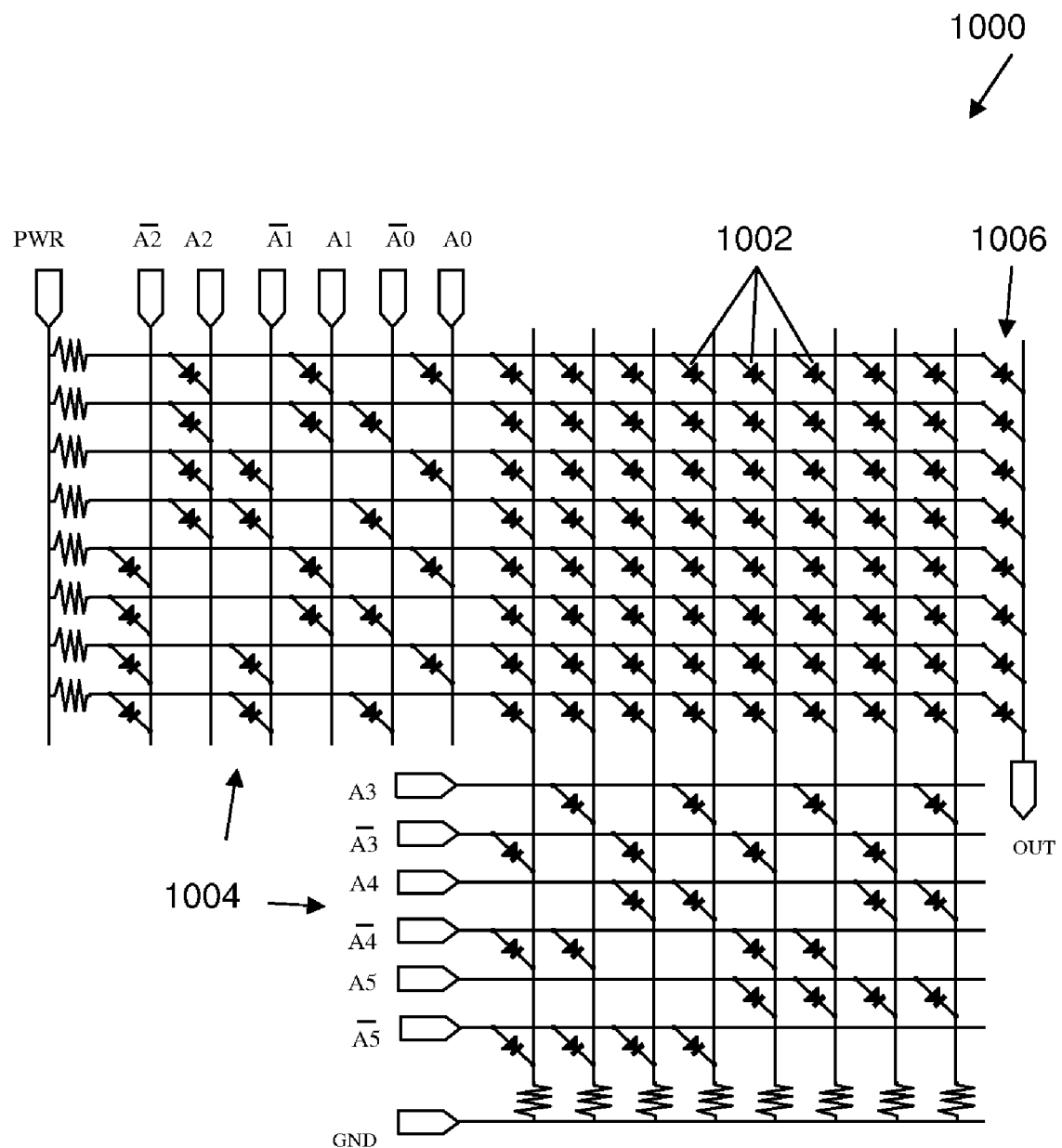
FIG. 10 illustrates one embodiment of a diode-decoded memory circuit using a field-emitter device in accordance with an embodiment of the invention.

FIG. 10 shows one embodiment of a diode-decoded memory circuit 1000 as disclosed in U.S. Pat. No. 5,673,218 that may be constructed according to embodiments of the present invention. Memory circuit 1000 includes a plurality of nonlinear electron-emitting devices 1002, the presence or absence of which at a memory bit location may signify a one bit or a zero bit, respectively. In another embodiment, a one or a zero bit may be signified by the state of a VCM material inside each device 1002. The memory bit locations are defined by the points of intersection of two sets of conductors 1004 (e.g., conductive wires) that overlap each other. The conductors may include or consist essentially of, e.g., a metal or a doped semiconductor. Each of the plurality of nonlinear electron-emitting devices 1002 may be a diode or a triode, as discussed above. Memory circuit 1000 may include address circuitry 1004 that selects a memory bit location by selecting the wires that intersect at that particular location. The address circuitry 1004 may itself include an array of nonlinear electron-emitting devices such as diodes or triodes. Memory circuit 1000 may also include output detection circuitry 1006 that detects the presence or absence of a nonlinear electron-emitting device at the memory bit location selected by the address circuitry. The output detection circuitry 1006 may include an array of nonlinear electron-emitting devices such as diodes or triodes.

Embodiments of the present invention may be utilized in memory devices and systems for storing digital text, digital books, digital music, digital audio, digital photography (wherein one or more digital still images is stored, including sequences of digital images), digital video, digital cartography (wherein one or more digital maps is stored), and any other digital or digitized information as well as any combinations thereof. These devices may be embedded, removable, or removable and interchangeable among other devices that access the data therein. They may be packaged in any variety of industry-standard form factors such as Compact Flash, Secure Digital, MultiMedia Cards, PCMCIA Cards, Memory Stick, and/or any of a large variety of integrated circuit packages including Ball Grid Arrays, Dual In-Line Packages (DIPs), SOICs, PLCCs, TQFPs, and the like, as well as in proprietary form factors and custom-designed packages. These packages may contain just the memory chip, multiple memory chips, or one or more memory chips along with other logic devices or other storage devices such as PLDs, PLAs, micro-controllers, microprocessors, memory controller chips or chip-sets, or other custom or standard circuitry. Packaging may include a connector for making electrical contact with another device when the device is removable or removable and interchangeable.

The foregoing description of an example of the preferred embodiment of the invention and the variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description.

What is claimed is:

1. An electronic device comprising:
a substrate comprising a dielectric material;
a plurality of recesses disposed within the substrate;
a bottom conductor disposed at a bottom portion of each recess;
a top conductor disposed at a top portion of each recess and electrically connected to an emitter disposed within each recess; and
a middle conductor disposed in a middle portion of at least one recess, the middle conductor separated from the emitter by a gap.

2. The electronic device of claim 1 wherein the bottom conductor comprises a plurality of generally parallel bottom conductive elements, the top conductor comprises a plurality of generally parallel top conductive elements, and the top conductors are substantially non-parallel to the bottom conductors.

3. The electronic device of claim 1 further comprising a coating over at least a portion of the bottom conductor, the coating comprising at least one of a high work-function material or a phase-change material.

4. The electronic device of claim 1 wherein the substrate comprises silicon dioxide, the bottom conductor comprises tungsten or gold, each emitter comprises molybdenum, and the top conductor comprises tungsten or gold.

5. A method for forming an electronic device, the method comprising:
forming a plurality of generally parallel bottom conductors on a substrate;
forming a layered structure over the plurality of bottom conductors, the layered structure comprising a middle conductor;
forming a plurality of recesses in the layered structure, thereby exposing a portion of a bottom conductor in each recess;
forming an emitter material within each recess; and
forming a plurality of generally parallel top conductors over the plurality of recesses, the top conductors being substantially non-parallel to the bottom conductors,
wherein the emitter material, a bottom conductor, and a top conductor forms a field emitter within each recess.

6. The method of claim 5 wherein the field emitter is a diode or a triode.

7. The method of claim 5 wherein a first field emitter is a diode and a second field emitter is a triode.

8. The method of claim 5 wherein a first field emitter has four or more terminals.

9. The method of claim 5 wherein the layered structure comprises or consists essentially of a dielectric film.

10. The method of claim 5 further comprising:
before forming the emitter material within each recess, forming a spacer material proximate an inner surface of each recess; and
after forming the emitter material within each recess, removing the spacer material from each recess.

11. The method of claim 10 wherein the layered structure comprises silicon dioxide, the spacer material comprises silicon nitride, each bottom conductor comprises at least one of tungsten and gold, the emitter material comprises molybdenum, and each top conductor comprises at least one of tungsten and gold.

12. The method of claim 10 further comprising, before forming the plurality of top conductors, removing portions of the spacer material and the emitter material disposed over the layered structure between the recesses.

13. The method of claim 12 wherein portions of the spacer material and the emitter material are removed by planarization.

14. The method of claim 5, wherein forming the layered structure comprises:
forming a first dielectric film over the plurality of bottom conductors;

forming the middle conductor over the first dielectric film; and forming a second dielectric film over the middle conductor and the first dielectric film.

15. The method of claim 14 wherein at least one recess intersects the middle conductor.

16. The method of claim 15 wherein at least one recess intersects only the first and second dielectric films.

17. The method of claim 5 further comprising encapsulating the plurality of recesses.

18. The method of claim 5 further comprising a coating disposed above at least one bottom conductor, the coating comprising at least one of a high work-function material and a phase-change material.

* * * * *